US006967172B2

(12) United States Patent
Leung et al.

(10) Patent No.: US 6,967,172 B2
(45) Date of Patent: *Nov. 22, 2005

(54) COLLOIDAL SILICA COMPOSITE FILMS FOR PREMETAL DIELECTRIC APPLICATIONS

(75) Inventors: Roger Leung, San Jose, CA (US);
Denis Endisch, Cupertino, CA (US);
Songyuan Xie, Newark, CA (US);
Nigel Hacker, Palo Alto, CA (US);
Yanpei Deng, Fremont, CA (US)

(73) Assignee: Honeywell International Inc., Morristown, NJ (US)

( * ) Notice: Subject to any disclaimer, the term of this patent is extended or adjusted under 35 U.S.C. 154(b) by 6 days.

This patent is subject to a terminal disclaimer.

(21) Appl. No.: 10/680,026

(22) Filed: Oct. 7, 2003

(65) Prior Publication Data

US 2004/0228967 A1 Nov. 18, 2004

Related U.S. Application Data (62) Division of application No. 10/188,433, filed on Jul. 3, 2002, now Pat. No. 6,653,718.

(51) Int. Cl.⁷ .............................................. H01L 21/302
(52) U.S. Cl. ....................................... 438/723; 438/724
(58) Field of Search ................................. 438/118, 777, 438/623, 624; 428/304; 257/634, 758

(56) References Cited

U.S. PATENT DOCUMENTS

| 3,634,558 A | | 1/1972 | Stober ........................ 264/0.5 |
| 3,658,584 A | | 4/1972 | Schmidt ...................... 117/201 |
| 3,663,277 A | | 5/1972 | Koepp et al. ................ 117/201 |
| 4,652,467 A | * | 3/1987 | Brinker et al. .............. 427/246 |
| 5,548,159 A | | 8/1996 | Jeng ............................ 257/634 |
| 5,858,871 A | | 1/1999 | Jeng ............................ 438/623 |
| 6,444,495 B1 | * | 9/2002 | Leung et al. ................ 438/118 |
| 6,653,718 B2 | * | 11/2003 | Leung et al. ................ 257/634 |

FOREIGN PATENT DOCUMENTS

| EP | 0 270 369 | 4/1994 |
| EP | 0 424 638 | 2/1998 |
| EP | 0 834 911 | 1/2002 |
| WO | WO 97/10282 | 3/1997 |
| WO | WO 00/41231 | 7/2000 |

OTHER PUBLICATIONS

PCT International Search Report dated Jan. 18, 2002.
PCT International Preliminary Examination Report dated Apr. 29, 2003.
A.K. Van Helden, et al. entitled "Preparation and Characterization of Spherical Monodisperse Silica Dispersions in Nonaqueous Solvents" Journal of Colloid and Interface Science, vol. 81, No. 2, Jun. 1981.

* cited by examiner

*Primary Examiner*—David Nelms
*Assistant Examiner*—Thinh T Nguyen
(74) *Attorney, Agent, or Firm*—Bingham McCutchen; Sandra P. Thompson (57) ABSTRACT

A colloidal suspension of nanoparticles composed of a dense material dispersed in a solvent is used in forming a gap-filling dielectric material with low thermal shrinkage. The dielectric material is particularly useful for pre-metal dielectric and shallow trench isolation applications. According to the methods of forming a dielectric material, the colloidal suspension is deposited on a substrate and dried to form a porous intermediate layer. The intermediate layer is modified by infiltration with a liquid phase matrix material, such as a spin-on polymer, followed by curing, by infiltration with a gas phase matrix material, followed by curing, or by curing alone, to provide a gap-filling, thermally stable, etch resistant dielectric material.

30 Claims, 2 Drawing Sheets

COLLOIDAL SILICA COMPOSITE FILMS FOR PREMETAL DIELECTRIC APPLICATIONS

This Application is a divisional of Ser. No. 10/188,433 filed Jul. 3, 2002 now U.S. Pat. No. 6,653,718.

FIELD OF THE INVENTION

The present invention relates generally to dielectric materials for use in semiconductor devices, and, more specifically to dielectric materials, prepared from colloidal dispersions, that have high thermal stability and etch resistance and completely fill narrow gaps.

BACKGROUND

In order to provide integrated circuits (ICs) with increased performance, the characteristic dimensions of devices and spacings on the ICs continue to be decreased. Fabrication of such devices often requires the deposition of dielectric materials into features patterned into layers of material on silicon substrates. In most cases it is important that the dielectric material completely fill such features, which may be as small as 0.01 to 0.05 $\mu$m or even smaller in next generation devices. Filling such narrow features, so-called gap filling, places stringent requirements on materials used, for example, for pre-metal dielectric (PMD) or shallow trench isolation (STI) applications. The pre-metal dielectric layer on an integrated circuit isolates structures electrically from metal interconnect layers and isolates them electrically from contaminant mobile ions that degrade electrical performance. PMD layers may require filling narrow gaps having aspect ratios, that is the ratio of depth to width, of five or greater. After deposition, the dielectric materials need to be able to withstand processing steps, such as high temperature anneal, etch, and cleaning steps.

Dielectric materials are commonly deposited by chemical vapor deposition (CVD) or by spin-on processes. Each of these approaches has some limitations for filling very narrow gaps. Plasma enhanced chemical vapor deposition (PECVD) processes provide high deposition rates at comparatively low temperatures (about 400° C.). The main drawback is that PECVD processes have a lower deposition rate inside a gap than at other locations on a surface. The differential deposition rates can create structures overhanging a gap opening, leading to voids within the gap. Typically, for spacings less than 0.25 $\mu$m, depending on the aspect ratio, it is difficult to achieve void-free gap fill using standard PECVD approaches.

Phosphosilicate glass (PSG) and borophosphosilicate glass (BPSG) are commonly used for premetal dielectric applications. The films are usually deposited using atmospheric pressure CVD (APCVD), sub-atmospheric pressure CVD (SACVD) or low pressure CVD (LPCVD). Depending on the process conditions and precursors used these methods can achieve an almost conformal coating. Gap-fill is achieved by a post-deposition reflow process in which the material is treated at high temperatures, typically 800–1200° C. The inclusion of phosphorous and boron, in particular, the boron, in the glass lower the glass transition and flow temperatures. However, the use of CVD followed by reflow in future advanced devices will be limited by the high thermal budget required for the reflow process, which is not compatible with certain materials and processes, such as cobalt silicide used at the contact level. For very narrow gaps, less than 0.2 $\mu$m, there is an increasing risk that voids may remain, even after high temperature processing.

Some workers have used high density plasma chemical vapor deposition (HDP CVD) to improve gap-fill of PSG and BPSG. In the high density plasma process, deposition and etching occur simultaneously. Etching is most efficient at the top corners of narrow openings, thereby compensating for a lower deposition rate inside the gap. HDP CVD deposition does not require high temperature processing, although an anneal step can be used if a denser film is desired. The HDP CVD process has the drawback that for narrower structures, lower deposition to etch ratios have to be used resulting in a relatively slow overall filling rate. Improved gap-fill may also require modifications in the design of device features, such as rounded corners and sloped sidewalls. Finally, there is also a concern about plasma damage to the device during HDP CVD processing.

Spin-on glasses and spin-on polymers such as silicates, siloxanes, silazanes or silsequioxanes generally have good gap-fill properties. The films of these materials are typically formed by applying a coating solution containing the polymer followed by a bake and thermal cure process. The utility of these spin-on materials may be limited, however, by material shrinkage during thermal processing. Thermal shrinkage is a key consideration for materials which have to withstand high process temperatures, such as materials used for pre-metal dielectric and/or shallow trench isolation applications, which may involve process temperatures exceeding 800° C. High shrinkage can lead to unacceptable film cracking and/or formation of a porous material, particularly inside narrow gaps. Cracked or porous material may have an undesirably high wet etch rate in subsequent process steps.

Thus there remains a need for a dielectric material that provides void-free gap-fill of narrow features at processing temperatures less than the reflow temperatures used currently. The gap-filling materials need to have high thermal stability and reasonable resistance to etching solutions to survive subsequent processing steps.

SUMMARY

A colloidal dispersion of particles composed of a dense material dispersed in a solvent is used in forming a gap-filling dielectric material with low thermal shrinkage. The particles are preferably of nanometer-scale dimensions and are termed nanoparticles. The dense material is either a dielectric material or a material convertible to a dielectric material by oxidation or nitridation. The dielectric material is particularly useful for pre-metal dielectric and shallow trench isolation applications. Oxides and nitrides of silicon, oxides and nitrides of aluminum, and oxides and nitrides of boron are useful as nanoparticle materials. Colloidal silica is particularly useful as the colloidal dispersion. The dielectric material optionally includes dopant species such as arsenic, antimony, phosphorous, or boron.

According to the methods of forming a dielectric material, the colloidal dispersion is deposited on a substrate and the deposited film is dried forming a porous intermediate layer. The intermediate layer is modified by infiltration with a liquid phase matrix material, followed by curing, where, in all cases, curing includes optionally annealing, by infiltration with a gas phase matrix material, followed by curing, or by curing alone, to provide a gap-filling, thermally stable, etch resistant dielectric material.

Infiltrating matrix materials applied in the liquid phase are spin-on polymers, including oligomers and monomers, that can be converted to silica or similar ceramic materials on high temperature cure, optionally in the presence of oxygen or steam. The matrix materials include, but are not limited to, silicates, hydrogen silsesquioxanes, organosilsesquioxanes, organosiloxanes, silsesquioxane-silicate copolymers, silazane-based materials, polycarbosilanes, and acetoxysilanes. The liquid matrix materials optionally include dopant species such as arsenic, antimony, phosphorous, or boron. In liquid phase infiltration, a coating solution of the matrix material is applied on the colloidal film.

Gas phase infiltration uses chemical vapor deposition (CVD) methods under conditions in which impinging molecules have a low sticking coefficient and/or high surface diffusion to avoid sealing a top surface of a narrow gap before bulk porosity the intermediate layer is reduced. The CVD deposited materials optionally include dopant species. Other gas phase deposition processes, such as atomic layer deposition, may also be used for gas phase infiltration.

The dried intermediate layer or the infiltrated intermediate layer is cured, for example in a furnace at temperatures of between about 600 and 800° C. or by rapid thermal processing, for example, at temperatures of between about 700 and 900° C. Optionally, one or more bake steps at temperatures, for example, between about 75 and 300° C. precede the curing process. In addition, the cure may be followed by a higher temperature annealing step. Curing, and optionally annealing, induces sintering of the nanoparticles and reflow of the infiltrated matrix material. Inclusion of dopant species in the nanoparticles or in the matrix materials lowers the reflow temperature.

Films prepapred according to the present invention fill narrow gaps, less than 100 nm and as small as 50–60 nm in width, without voids or cracks. They do not show delamination of cracking even after heat treatment at 900° C. The cured films have minimized open porosity as evidenced by their resistance to etchant solutions in filled gaps. Further, the average etch rate of cured films on blanket wafers is on the same order as the average etch rate of silicon dioxide films produced by chemical vapor deposition. Thus, films prepared according to the present processes are advantageously used as pre-metal dielectric and shallow trench isolation materials.

DETAILED DESCRIPTION

Methods of forming a gap-filling dielectric material with low thermal shrinkage make use of a colloidal dispersion of dense particles. A coating solution of the colloidal dispersion is deposited on a substrate to form a film, and the film is intentionally modified by one or more approaches. The dielectric material is beneficially used for pre-metal dielectric and shallow trench isolation applications.

Key to the present invention is the nature of the colloidal dispersion. Colloids are generally defined as systems in suspension in which there are two or more phases. In the colloidal suspension, one of the phases, termed the dispersed phase, is distributed in the other phase, termed the continuous phase. A familiar type of colloid consists of dispersions of small particles in a liquid.

According to one aspect of the present invention, a colloidal dispersion of nanometer scale particles, termed nanoparticles, composed of a dense material dispersed in a solvent is used. The dense material is either a dielectric material or a material convertible to a dielectric material by reaction with oxygen or nitrogen. In addition, the physical size of the nanoparticles needs to be substantially unchanged by thermal processing. The size of the nanoparticles should not be reduced by more than 10% when exposed to temperatures of about 700° C. In the event the nanoparticles are composed of a material such as silicon or aluminum, convertible to a dielectric material by oxidation or nitridation, the particle size may increase somewhat during curing in the presence of an oxygen- or nitrogen-bearing species.

Silicon and aluminum and refractory oxides and nitrides of silicon and aluminum are useful nanoparticle materials. Additional useful materials include nitrides, such as boron nitride and gallium nitride, and also boron oxide and boron carbide. Suitable dense, silicon-containing materials for use as nanoparticles include silica, silicon, silicon nitride, silicon oxynitride, and combinations and mixtures thereof. For example, colloidal silica is advantageously used as the colloidal dispersion. Methods for forming colloidal silica are known in the art as described, for example, in U.S. Pat. No. 3,634,558 and in Van Helden et al., (J. Colloid Interface Sci. 81, 354 (1981)), both of which are incorporated herein by reference. In addition, colloidal silica is available commercially. A general criterion is that the nanoparticles experience little or no chemical change during a high temperature cure process with the exception of oxidation or nitridation, as discussed above. However, as long as the low shrinkage criterion is met, nanoparticles may additionally contain small quantities of silicon polymers such as hydridosilsesquioxanes, organosiloxanes, organosilsesquioxanes, and perhydrosilazanes.

The nanoparticles have a characteristic dimension between about 2 nm and about 50 nm. The colloidal dispersion has excellent gap-filling capability, limited only by the particle size. For any specific application, the particle size is chosen to be smaller than the width of the opening to be filled. The size distribution of the nanoparticles may be monodisperse, bimodal, or polydisperse. Bimodal distributions may be tailored to provide a higher packing density of nanoparticles, in which smaller particles fit into voids generated by packing of larger particles. The nanoparticles are dispersed in an organic solvent or inorganic solvent, such as an aqueous solvent or solvent mixture, or in a supercritical fluid. Suitable organic solvents include solvents commonly used in coating solutions of spin-on polymers, such as methanol, ethanol, isopropyl alcohol, methylisobutylketone, cyclohexanone, acetone, and anisole, to name only a very few. The solid content of nanoparticles in the colloidal dispersion typically ranges from as little as 0.5 weight % to as much as 20%. Higher or lower concentrations may be used to adjust the coating thickness. Additional additives such as surfactants or binders may also be present in the dispersion. Infiltration matrix materials described below are useful as binders when added to the dispersion in small quantities, for example in a ratio of nanoparticle to binder greater than about 10:1.

According to another aspect of the present invention, the nanoparticles include dopant species such as arsenic, antimony, phosphorous, or boron. Including such dopants may enhance material properties of the film formed from the colloidal dispersion. For example, dopants are introduced to increase mobile ion gettering and to lower the glass transition temperature. Boron is used, among other reasons, to produce a dielectric material with increased etch resistance.

A film of the colloidal dispersion is typically formed on a substrate by spin coating. Other methods known in the art for applying coating solutions such as dip coating or spray coating may alternatively be used. The coated film is dried evaporating the solvent in the dispersion. The coated film may be dried during the spin-coating process, for example by a fast spin, or by a rest period following the dispense step. Alternatively, the coated film may be heat treated by methods such as lamp heating, baking on a hot plate, at one or more temperatures between about 75 and 300° C., or by other methods known in the art. In addition to evaporating the solvent, the heat treatment may serve to keep the particles attached to the substrate, so that they are not removed/rinsed away during the subsequent infiltration. The heat treatment may also have the effect of reacting the optional binder material. The film thus formed on the substrate is typically porous in nature with an open pore structure. For applications such as PMD or STI layers, it is desirable to minimize porosity of the film in order to minimize thermal shrinkage and moisture sensitivity and to maximize thermal stability and etch resistance. It is also desirable to change the open pore structure to a closed pore structure. Eliminating open porosity improves the chemical resistance such as etch resistance of the material during subsequent processing steps. To minimize open porosity, a film formed from the colloidal suspension is modified by one or more approaches. The processes include infiltration with a matrix material applied in the liquid phase, infiltration with a matrix material applied in the gas phase, and cure/anneal processes.

Infiltrating matrix materials applied in the liquid phase are spin-on polymers that can be converted to silica or similar ceramic materials during a cure process. An example is a high temperature cure, optionally in the presence of oxygen or steam. The term spin-on polymer, as used here, includes oligomers and monomers, as well as polymers. The matrix materials include, but are not limited to, silicates, hydrogen silsesquioxanes, organosilsesquioxanes, organosiloxanes, organhydridosiloxanes, silsesquioxane-silicate copolymers, silazane-based materials, polycarbosilanes, and acetoxysilanes. Suitable commercial matrix materials include silicates of the T11 and T14 series, the spin-on-glass Accuspin™, and the organohydridosiloxane HOSP™, all provided by Honeywell International, Inc. (Morristown, N.J.).

In liquid phase infiltration, a coating solution of the matrix material is applied on the colloidal film, typically by spin coating, although alternative application methods may be used. Low molecular weight matrix materials have the benefit of more easily penetrating narrow spaces between the nanoparticles. Matrix materials with molecular weights ranging from several hundreds to multiple thousands of atomic mass units (amu) may be desirable. Infiltrating molecules with hydrodynamic diameters less than 1–2 nm are advantageous to infiltrate small pores. Solid content of the infiltrant solution may range from nearly 100% solid to as low as 2% solid. The infiltrating matrix material occupies space between the nanoparticles, minimizing open porosity. In addition, depending on the molecular weight of the matrix polymer, the matrix material may also form an overlayer on top of the infiltrated colloidal layer, as described, for example, in Example 5 below.

In some embodiments, dopant species, such as arsenic, antimony, phosphorous, or boron, as described above, are included in the matrix materials. Dopants are introduced, for example, to increase mobile ion gettering and to lower the glass transition temperature of the gap-filling dielectric material. The introduction of phosphorous has been observed to provide better gap-filling properties and boron is used, among other reasons, to produce a dielectric material with increased etch resistance and to provide coating solutions for applying the dielectric material with longer shelf life. Dopants may be provided for other reasons, as well. In particular, boron and phosphorous doped silicates and silsesquioxanes are useful doped matrix materials. Suitable phosphorous doped silicates include the phosphosilicate products P062A, P082A, P112A, P064A, P084A, and P114A, all provided by Honeywell International, Inc. (Morristown, N.J.). A boron doped silsesquioxane is prepared, for example, by adding a solution of boron oxide in isopropyl alcohol to a silsesquioxane solution as described below in Example 3. A boron and/or phosphorous doped silicate is prepared by including a boron and/or phosphorous precursor in the synthesis of the silicate polymer. Suitable phosphorous precursors include but are not limited to $P_2O_5$, $H_3PO_4$, and trialkylphosphates, such as trimethylphosphate, and triethylphosphate. Suitable boron precursors include but are not limited to $B_2O_3$, $H_3BO_3$, and trialkylborates, such as trimethylborate, and triethylborate. The synthesis of boron and phosphorous doped silicate using $P_2O_5$ and $B_2O_3$ as reactants is described below in Example 7. Alternatively, the matrix material may comprise a mixture of the undoped spin-on polymer and the boron and/or phosphorous precursors described above. Additional dopant-containing molecules useful in dopant/matrix material mixtures include phosphazenes, borazenes, and borophosphates.

In an alternative embodiment, the matrix material is included as a component of the colloidal dispersion. Pre-mixing the colloidal dispersion and the matrix material has the advantage of eliminating the process step of applying a coating solution of the matrix material. In the case of pre-mixing, the fraction of added matrix material is such that the majority of the volume in the gap is occupied by the nanoparticles in order to minimize thermal shrinkage of the dielectric material. For example, the ratio of nanoparticles to matrix material is greater than or about 1:1. Note that when the matrix material is used as a binder in the colloidal dispersion, the ratio of nanoparticles to matrix material is much greater than when the matrix material is premixed in the colloidal suspension.

Gas phase infiltration with matrix materials provides a second approach to densification. Gas phase infiltration processes include chemical vapor deposition (CVD) and atomic layer deposition. For use as an infiltration process, CVD conditions are adjusted to avoid sealing a top surface before bulk porosity is reduced. The CVD process is performed, therefore, in a reaction rate limited process regime, achieved, for example, by conditions in which impinging molecules have a low sticking coefficient and/or high surface diffusion. The sticking coefficient is the probability of an arriving molecule to react on the surface. A sticking coefficient of 1 means that every molecule will remain on the surface. For successful infiltration using CVD, the sticking coefficient has to be smaller than 0.01. For a thermal CVD process this can usually be achieved by choosing a deposition temperature lower than the standard process temperature. For typical CVD deposition of material layers on flat surfaces, such conditions would result in unacceptably low deposition rates. However, in the present application to deposition on a highly porous film, the surface area can be many times larger than the flat surface substrate area, enhancing the effective deposition rate to practical levels. An exemplary gas phase densification process is CVD deposition of tetraethoxysilane (TEOS) and oxygen at a temperature between about 400 and 600° C. Infiltration deposition temperatures are significantly lower than the about 600 to 700° C. process conventionally used for CVD of the TEOS/oxygen system. Dopants, as listed above, can be included in the CVD infiltration process by including dopant precursor gases along with the CVD reactant gases. Examples of dopant precursors may include boron oxides, triethylborate, alkylboranes, and diborane for boron doping, and triethylphosphate, trimethylphosphate, and phosphine for phosphorous doping.

Atomic layer deposition (ALD) provides an alternative gas phase infiltration process. In ALD, each atomic layer is deposited by alternatively supplying a reaction gas and a purging gas. Thus, ALD is an excellent approach to forming a conformal, uniform coating of the entire pore surface structure of the colloidal dispersion layer. An example for an ALCVD process for a depositing $Al_2O_3$ uses $Al(CH_3)_3$ and water vapor as precursors. An ALCVD coating consisting of less than 20–30 atomic layers is beneficially used in the present invention. Larger numbers of atomic layers may also be used.

Curing processes, which may include thermal processing or annealing methods, such as electron beam annealing or ion beam annealing, or combinations thereof, provide a third approach to modification of the open pore structure. The curing process may be applied to the as-deposited colloidal dispersion, or to the film after a liquid phase or gas phase infiltration process has been performed. All methods of forming a gap-filling dielectric material according to the present invention include a curing step. Optionally, one or more bake steps at temperatures between about 75 and 300° C. may precede the curing process. The film is cured in vacuum or in an atmosphere of commonly used gases such as nitrogen, oxygen, ozone, steam, ammonia, argon, carbon monoxide, carbon dioxide, nitrous oxide, nitric oxide, helium, hydrogen, forming gas, or mixtures thereof. For nanoparticles of a material, such as silicon, convertible to a dielectric by oxidation or nitridation, a curing atmosphere containing an oxygen or nitrogen bearing species is used.

An exemplary curing process is curing in a furnace at temperatures between about 600 and 800° C. in a nitrogen/ oxygen atmosphere for a time period less than about 2 hours. Alternatively, the film is cured by rapid thermal processing (RTP) at a temperature between about 700 and 900° C. for a period of about 10 seconds to 5 minutes. Optionally, particularly for processes in which neither the nanoparticles nor the matrix material are doped materials, curing may be followed by a higher temperature thermal annealing step. An exemplary annealing process uses temperatures between about 800 and 1000° C. in a nitrogen atmosphere. In the present processes, curing modifies the dielectric film everywhere on a substrate including inside narrow gaps and in open regions.

The present processes are used to deposit dielectric materials on substrates in the fabrication of integrated circuit devices. Integrated circuit devices include but are not limited to silicon based devices, gallium arsenide based devices, opto-electronic devices, focal plane arrays, photovoltaic cells, and optical devices. As is well known, integrated circuit devices generally include a substrate, conductive circuit lines, and dielectric material. In addition, barrier layers, etchstop layers, and conducting gates, such as poly-silicon gates, are included in the devices. The interconnected circuit lines function to distribute electrical signals in the device and to provide power input to and signal output from the device. Integrated circuit devices will generally include multiple layers of circuit lines which are interconnected by vertical metallic studs, that is metal-filled vias. Suitable substrates include, but are not limited to, silicon, silicon dioxide, glass, silicon nitride, ceramics, and gallium arsenide. As used herein, substrates refers to any of the layers, planarized or having topography, including, semiconducting wafers, dielectric layers, gates, barrier layers, etchstop layers, and metal lines found in integrated circuit devices.

Figure 1:
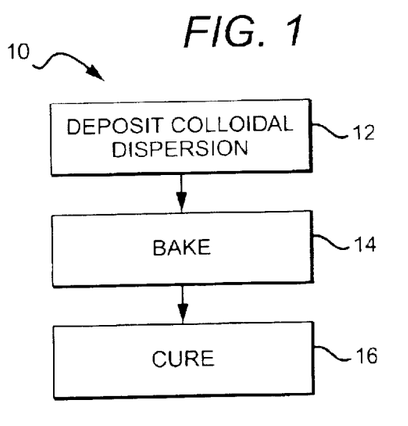
FIG. 1–3 are flow diagrams of processes of forming a dielectric material according to embodiments of the present invention.
Figure 2:
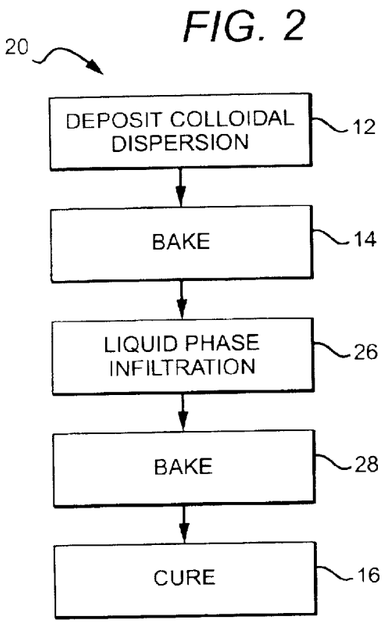
Figure 3:
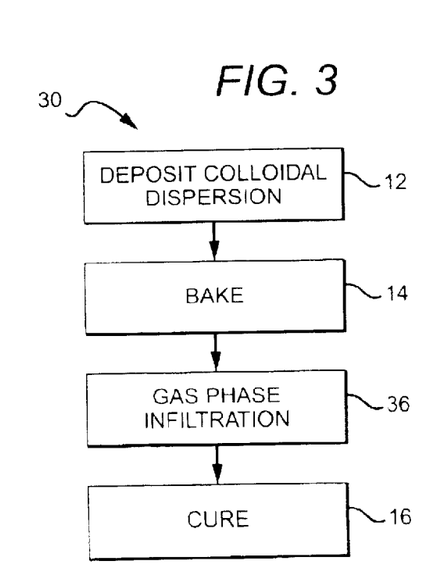

The principal methods of forming a gap-filling dielectric material according to the present invention are summarized in the process flow diagrams of FIGS. 1–3. FIG. 1 describes a process 10 of forming a film without infiltration with a matrix material. A colloidal dispersion of nanoparticles is deposited on a substrate, at step 12, followed by an optional bake step 14. The nanoparticles may be doped or undoped. The final step of process 10 is a cure process 16 as described above. Process step 16 in FIGS. 1–3 implicitly includes an optional higher temperature anneal. FIG. 1 also describes the alternative process of forming a dielectric material in which matrix material is premixed into the colloidal dispersion at step 12. When depositing a premixed dispersion, bake step 14 is included in the process.

FIGS. 2 and 3 describe processes 20 and 30 including infiltration with a liquid matrix material and by a gas phase process, respectively. In processes 20 and 30, deposition of the colloidal dispersion, step 12, is followed by an optional bake process, 14. For liquid phase infiltration, process 20, at step 26, a coating solution of the matrix material is applied over the film formed from the colloidal dispersion. The coating solution at step 26 may contain dopants including but not limited to boron and/or phosphorous. Step 26 may optionally include multiple applications of a coating solution of matrix material. Coating the matrix material is followed by a bake step, 28, and cure step 16. In the gas phase infiltration process, 30, after depositing the colloidal dispersion at step 12 and an optional bake process at step 14, a matrix material is deposited on the nanoparticles by chemical vapor deposition, at step 36. Materials containing dopants such as boron and phosphorous are beneficially used at step 36. A cure step 16 completes process 30. Processes 20 and 30 provide a composite gap-filling dielectric material consisting of the matrix material surrounding nanoparticle filler material.

Figure 4:
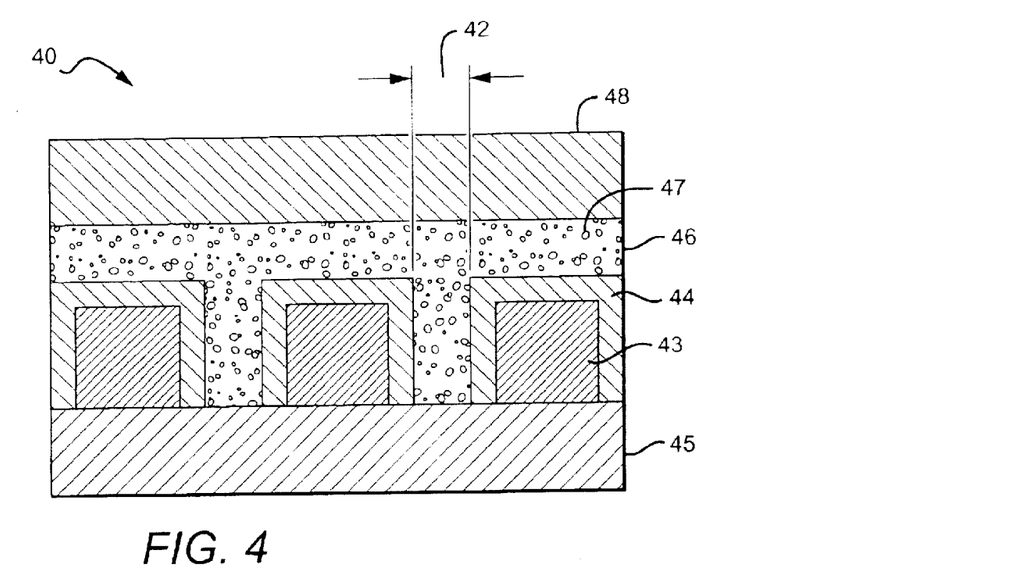
FIG. 4 is a pre-metal layer filled with a dielectric material formed according to an embodiment of the present invention.
Figure 5:
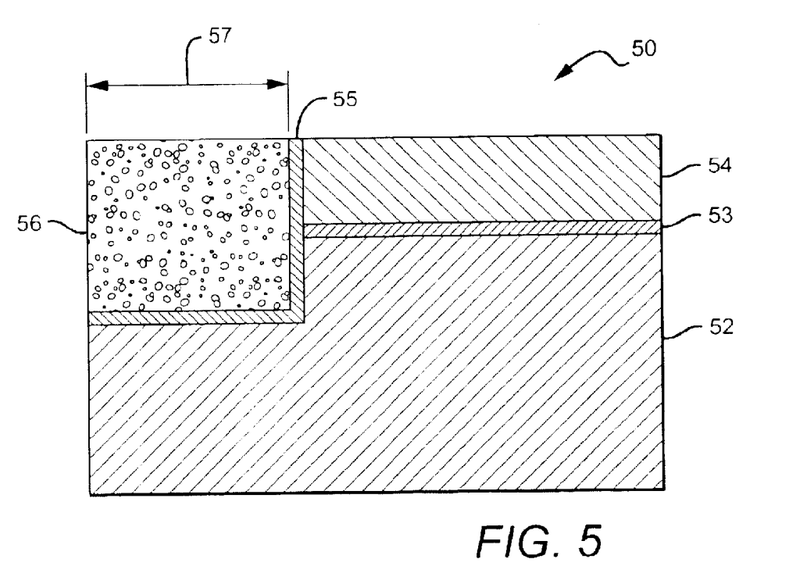
FIG. 5 is a shallow trench isolation structure filled with a dielectric material formed according to embodiments of the present invention.

The present material is particularly useful for filling narrow gaps with a dielectric material in a pre-metal layer and for filling trenches in shallow trench isolation structures, as illustrated schematically in FIGS. 4 and 5, respectively. Pre-metal layer 40 in FIG. 4 includes poly-silicon gates 43, and a barrier layer 44, on a substrate 45. Gap 42 can be even narrower than the "minimum feature size," as commonly defined by the limitations of photolithographic methods. The particular embodiment illustrated in FIG. 4 shows dielectric layer 46, including nanoparticles 47, topped by an overlayer 48 of cured infiltrating matrix material. The matrix material also occupies space between the nanoparticles (not depicted). Using a colloidal silica to provide the nanoparticles and boron-doped silsesquioxane as the infiltrating matrix material, gaps smaller than 100 nm, as small as 50–60 nm in width (0.05–0.06 μm), have been completely filled without delamination, as described in Example 5 below.

An exemplary shallow trench isolation structure 50 depicted in FIG. 5 includes substrate 52, pad oxide layer 53, hard mask 54, liner oxide 55, and trench 56 filled with the present dielectric material. A characteristic dimension 57 of the shallow trench is typically 1–2 times the "minimum feature size." Thus, STI applications also require a material that fills narrow openings. For STI use, nanoparticles are typically composed of silica, silicon, or mixtures thereof. Infiltration is performed in the liquid phase or in the gas phase, preferably with an oxide or with matrix material that can form an oxide, such as $SiO_2$, or $Al_2O_3$. For gas phase infiltration, silicon oxide may be deposited using standard CVD precursors, which include but are not limited to tetraethoxysilane (TEOS) and oxygen or ozone, or silicon may be deposited using precursors which include dichlorosilane or trichlorosilane.

The benefits of the present gap-filling dielectric material may be understood in terms of the microscopic transformations to the material taking place during cure step 16, principally the processes of sintering and reflow. Sintering is conventionally defined as the process of heating and compacting a powdered material at a temperature below its melting point, or glass transition temperature, in order to weld the particles together into a single rigid shape.

Reflow occurs at temperatures above the glass transition temperature and induces physical conformational changes. The reflow mechanism for PSG and BPSG materials is described by R. A. Levy (J. Electrochem. Soc., Vol 133, No. 7, pp. 1417 (1986)). Reflow is driven by surface tension forces. The forces are proportional to $\sigma/R^2$, where $\sigma$ is the surface tension and R is the radius of curvature. For conventional BPSG reflow the radius of curvature is on the order of 100 to 500 Å for conformal coating of narrow gap, whereas the radius of curvature between the particles in the porous film is on the order of 5 to 50 Å, depending on particle size. The surface tension forces inside the porous film can therefore be several orders of magnitude larger than for conventional coating, thus inducing reflow at even higher viscosities. Therefore, reflow can convert an initially open pore structure to a closed pore structure at a lower temperature (or shorter time at same temperature) than would be required for conventional reflow.

For process 10, that does not include infiltration with a matrix material, the deposited colloidal dispersion, after removal of the solvent, consists essentially of the nanoparticles. In these cases, curing may induce sintering of the nanoparticles. Using nanoparticles containing phosphorous or boron dopants lowers the minimum temperature needed for sintering. Using doped nanoparticles also lowers the glass transition temperature such that reflow of doped nanoparticles can occur at the furnace cure and RTP temperatures described above.

For processes 20 and 30, which include infiltration with matrix materials, the curing process can induce chemical changes in the matrix material. For example, using the silicon-containing spin-on polymers listed above for liquid phase infiltration, curing in an atmosphere containing oxygen converts the matrix material to silica or silicon oxynitride. In addition, when the nanoparticles are composed of a material convertible to a dielectric, such as silicon, curing in an oxygen or nitrogen atmosphere induces chemical changes in the nanoparticles, as well. The reflow and sintering properties of the matrix material may be tuned through doping. For example using matrix materials containing phosphorous or boron lowers the reflow temperature so that curing induces both chemical and physical change. In the present case, reflow occurs at temperatures lower than those required for conventional BPSG glasses. Without being bound to any theory, the inventors attribute the lower reflow temperature to the fact that the driving force for reflow is surface energy, which is inversely proportional to radius of curvature. For the colloidal dispersions of nanoparticles of the present films, the relevant radius of curvature is Angstroms while it is hundreds of Angstroms for conventional BPSG reflow processes. In addition, in the present instance, the required flow distance is more than an order of magnitude smaller.

Thus it may be understood that thermal processing modifies the gap-filling dielectric material, minimizing open porosity, reducing its porosity, and, in some cases, increasing its density, by sintering nanoparticles together and/or by inducing reflow in the nanoparticles and/or in the matrix material. The higher the process temperature, the greater the resulting modification to the pore structure. Reducing the open porosity increases the resistance of the dielectric material to commonly used buffered oxide etchant (BOE) solution, for example a solution containing ammonium fluoride and/or hydrogen fluoride. As reported in the examples below, dielectric material formed from a colloidal dispersion of silica nanoparticles by thermal processing alone, process 10, and also formed from silica nanoparticles by infiltration with boron doped hydrogen silsesquioxane, process 20, was used to fill gaps in a patterned wafer. Both the infiltrated and non-infiltrated material in the gaps were resistant to a standard 500:1 BOE solution. High process temperatures are associated, however, with material shrinkage which can lead to cracking or delamination of materials in narrow gaps. Use of the dense nanoparticles in the present methods minimizes thermal shrinkage. For colloidal silica without infiltration for example (see Example 2 below), after annealing at 900° C., total thickness shrinkage of only 4.5% with respect to the baked film has been observed. Therefore, thermal processing temperatures can be selected according to the present methods to provide gap-filling dielectric materials that are both crack free and resistant to etchants.

The features and benefits of the present invention are further illustrated but not limited by the following experimental examples.

Analytical Test Methods

In characterizing experimental results, refractive index and film thickness was measured using a Woollam Variable Angle Spectroscopic Ellipsometer Model MMA. Film thickness samples were measured post-bake, post-cure, and post-anneal. Percentage shrinkage was calculated as the change in film thickness divided by the post-bake thickness. Coated patterned wafers after bake were cleaved to reveal feature sizes. The cross section was gold stained with a thin gold layer. Scanning Electron Microscope (SEM) images at magnifications ranging from 40,000 to 100,000 were obtained using a JOEL JSM model 6330F SEM apparatus.

EXAMPLE 1

Preparation of Colloidal Dispersion Of Silica

A 1.8 wt % colloidal silica dispersion in cyclohexanone was prepared by combining 50.3 gm of a 10 wt % colloidal silica stock solution in cyclohexanone (Catalyst and Chemical Industries Co, Japan) with 225 gm cyclohexanone. Average particle diameter of the colloidal silica was 10.5 nm. Analysis of the metal concentration of the solution gave: Ca: 4.8 ppb; Cr: <1 ppb; Cu: 4.2 ppb; Fe: <5 ppb; Mg: 0.7 ppb; Mn: <1 ppb; Ni: <0.5 ppb; K: <5 ppb; and Na: 16 ppb.

A 3.5 wt % colloidal silica dispersion in cyclohexanone was prepared by mixing 90.6 gm of the 10% colloidal silica stock solution with 170 gm cyclohexanone. The solutions were homogenized by ultrasonic agitation for 30 minutes and then filtered through a 0.1 micron filter before being used in spin coating onto blanket or patterned wafers.

EXAMPLE 2

Coating of the Colloidal Silica Solution

The 1.8 wt % colloidal silica solution of Example 1 was spincoated onto an 8 inch silicon blanket wafer, hereafter termed a blanket wafer, and onto a patterned wafer with feature sizes ranging from 50 nm to several microns with step heights of 0.2 to 0.4 µm. The spin conditions included a dynamic dispense for 3 seconds at 300 rpm with dispense volume of 2 ml, followed by final spin at 2000 rpm for 20 seconds with acceleration of 50 rpm/sec. The coated wafers were baked at 80° C., 150° C. and 250° C. for one minute each, cured, and annealed. During the cure, the temperature was ramped from 450° C. to 700° C. at a rate of 5° C./min and then held at 700° C. for 30 minutes. Cure atmosphere was $N_2$, at 16 liter/min and $O_2$ at 4 liter/min. The wafers were annealed at 900° C. in flowing nitrogen for 20 minutes.

Film thickness and shrinkage of the silica film on the blanket wafer after each processing step are listed in Table 1. Crack-free clear films with no visible defects were obtained when deposited on blanket wafers. Film thickness was measured with a spectroscopic ellipsometer (J. A. Woolam VASE.) Film non-uniformity was less than 2%.

TABLE 1

Film Thickness and Shrinkage of Silica Film

| | Film Thickness | Refractive Index | Shrinkage from Bake |
|---|---|---|---|
| Post-bake | 491 Å | 1.24 | — |
| Post-cure | 485 Å | 1.23 | 1.5% |
| Post-anneal | 478 Å | 1.24 | 4.5% |

A refractive index of 1.24 indicated that the deposited film had a porous silica structure. This refractive index value may be compared with a refractive index of 1.36 for a 20% porous silica film and with a refractive index of 1.45 for non-porous silica films. The porous films showed very low shrinkage even after heat-treating to as high as 900° C.

The gap-filling ability of the colloidal silica in narrow gaps of the pattern wafers was determined from SEM pictures of the cleaved wafers. SEM pictures were taken for (i) the post-bake, (ii) post-cure and (iii) post-anneal wafers. All three SEM images showed that the silica nanoparticles uniformly fill gaps size ranging from 50 nm to several microns in size. There were no delamination or cracking after cure and after anneal and the nanoparticles also fill the corners around the bottom of the gaps.

EXAMPLE 3

Preparation of Boron-Doped Silsesquioxane Solution 8.2 gm of triethoxysilane, 0.60 gm of deionized water and 0.75 gm of 0.02 N nitric acid were added to 41 gm of acetone in a plastic bottle. The mixture was allowed to remain at room temperature for 18 hours and then diluted with 50 gm of n-propoxy propanol and 20 gm of denatured ethanol to form a base silsesquioxane solution.

3 gm of boron oxide ($B_2O_3$) was dissolved in 100 gm of isopropyl alcohol to form a 3% boron oxide solution. 6.66 gm of the 3% boron oxide solution was added to 100.55 gm of the base silsesquioxane solution. The molecular weight of the boron-doped silsesquioxane resin was 1256 atomic mass units from gel permeation chromatography. The resin contained 2.0% boron by weight. The molecular weight of the resin after 15 days at room temperature was 1797.

COMPARATIVE EXAMPLE 4

Coating of Boron-Doped Silsesquioxane Solution

The boron doped silsesquioxane solution of Example 3 was coated onto a 6" blanket wafer and onto a pattern wafer using the spin, bake, and cure cycles of Example 2. Film properties were listed in Table 2. Post-bake film thickness of 1100 Å on the blanket wafer was obtained from two coating steps with a bake cycle between the coating steps. A good quality film was obtained on a blanket wafer. The FTIR spectrum of the cured film showed that the silane (SiH) evidenced in the post-bake film by peaks at 2000–2250 $cm^{-1}$ and 800–900 $cm^{-1}$ had been converted to silica and as a result, a boron-doped silica film had been produced.

TABLE 2

Film Thickness and Shrinkage of Boron-Doped Silsesquioxane Film

| | Film Thickness | Refractive Index | Shrinkage from Bake |
|---|---|---|---|
| Post-bake | 1110 Å | 1.410 | — |
| Post-cure | 868 Å | 1.438 | 21.8% |
| Post-anneal | 800 Å | — | 28% |

The gap filling behavior of the material was observed from SEM pictures taken after each processing step. The boron-doped silsesquioxane filled gaps in the patterned wafer without void or delamination down to the narrowest size of about 50–60 nm after the post-bake. After a 700° C. cure in nitrogen/oxygen, the silica formed showed no delamination, but a lower density material was identified around the lower corners of the gap, based on SEM brightness of that region. After a 900° C. anneal in nitrogen, delamination and cracking occurred due to further shrinkage induced in the annealing.

EXAMPLE 5

Infiltration of Colloidal Silica Film with Boron-Doped Silsesquioxane

The 1.8 wt % colloidal silica solution from Example 1 was used to coat a patterned wafer, following the spin and bake conditions of Example 2. After bake, the boron-doped silsesquioxane solution from Example 3 was spin coated onto the coated patterned wafer using the spin/bake sequences of Example 4. The infiltrated wafer was then cured and annealed using the cure and anneal conditions of Example 2.

The extent of gap-filling in the patterned wafer was determined by examining the SEM pictures of the gaps of various sizes. For all the post-bake, post-cure and post-anneal samples, there were no delamination inside the gap of all sizes-down to the narrowest size of about 50–60 nm. An overlayer of boron-doped silica was formed on top of the infiltrated colloidal silica film. The thickness of the overlayer was about 200 nm.

EXAMPLE 6

Etching Resistance

Silica coated blanket wafers of Example 2 boron-doped silsesquioxane coated wafers of Example 4 were dipped into 500:1 BOE (buffered oxide etchant) solution containing ammonium fluoride for 180 seconds at an etch temperature of 21° C. After etching, the treated wafers were rinsed with deionized water and the film thickness was measured. The etch rate of silicon oxide produced by CVD deposition of TEOS was used as a reference for comparison. Etch rate was calculated as the decrease of film thickness divided by the etch time. Etch rate in Å/sec and relative etch rate with respect to that of CVD TEOS were listed in Table 3. The average etch rate of the CVD TEOS was about 0.45 Å/sec.

TABLE 3

Etch Rate of Colloidal Silica and Boron-Doped Silsesquioxane Films

|  | Etch Rate (Å/sec) | Etch Rate relative to CVD oxide |
| --- | --- | --- |
| Post-cure Colloidal Silica | 7.0 | 15 |
| Post-anneal Colloidal Silica | 1.7 | 3.8 |
| Post-cure B-silsesquioxane | 0.66 | 1.5 |

Coated patterned wafers of Examples 2, 4, and 5 were dipped in 500:1 BOE solution for 20 seconds, followed by a deionized water rinse. SEM pictures of the etched samples were taken to examine the etch resistance of the dielectric filled in the narrow gaps. Results are summarized below.

TABLE 4

Etching of Patterned Wafers

|  | Heat Treatment | Etching of Gap Dielectric |
| --- | --- | --- |
| Example 2 | Post-cure | no crack, no etching |
| Example 2 | Post-anneal | no crack, no etching |
| Example 4 | Post-cure | severely etched |
| Example 4 | Post-anneal | crack before etching, etched out |
| Example 5 | Post-cure | no crack, no etching |
| Example 5 | Post-anneal | no crack, no etching |

The inclusion of silica nanoparticle in the dielectric has shown two major benefits: (1) elimination of cracking or delamination induced by 700–900° C. heat treatment and (2) significant improvement in the etch resistance of the gap dielectric to BOE etching. These benefits are due to the low shrinkage and high density achieved by using the inert filler composite approach.

EXAMPLE 7

Synthesis of Doped Silicates

To 10.0 gm of a 5% solution of $P_2O_5$ in 2-propanol, 0.38 gm $B_2O_3$ was dissolved with stirring for 1 hour. 9 gm TEOS in 9.5 gm acetone was added followed by the addition of 1.38 gm 1N $HNO_3$ and 0.5 gm water. The mixture was heated to boiling around 66° C. and maintained for 3 hours. The molecular weight was about 2000 amu. The silicate resin was estimated to have 8% by weight phosphorus and 4% by weight boron. The solid content of the solution was 8 wt %.

EXAMPLE 8

Infiltration of Colloidal Silica Film with Doped Silicate

A colloidal silica film was deposited onto a blanket wafer using the 1.8 wt % colloidal silica solution from Example 1. The spin recipe was 5 seconds at 300 rpm for dynamic dispense of 2 ml of solution followed by a 20 second spin at 2000 rpm. The wafer was baked at 80° C., 150° C. and 250° C. for one minute each. The film thickness was 520 Å with a refractive index of 1.23.

The porous silica film was infiltrated with the doped silicate solution from Example 7. A rinsing solution consisting of 50 wt % 2-propanol and 50 wt % acetone was prepared. The following infiltrating and rinsing procedure was used: (1) dynamic dispense of 4 ml of doped silicate solution onto the wafer at 300 rpm for 5 seconds; (2) spread of liquid at 1000 rpm for 1 second; (3) rest for 5 seconds; (4) dynamic rinse using 4 ml of rinsing solvent for 5 seconds at 300 rpm; and (5) final spin at 2000 rpm for 20 seconds.

The infiltrated film was baked at 80° C., 150° C. and 250° C. for one minute each. Film thickness after bake was 517 Å with refractive index of 1.43. The increase of refractive index to the value of 1.43 showed that a solid non-porous film was been produced.

EXAMPLE 9

Infiltration of Colloidal Silica Film with Doped Silicate

The 1.8 wt % colloidal silica solution of Example 1 was used to coat a patterned wafer using a dynamic dispense of 3 ml in 3 seconds at 300 rpm, followed by a final spin of 2000 rpm for 20 seconds. One minute after spin without baking, 3 ml of doped silicate solution from Example 7 was dispensed onto the wafer in 3 seconds while spinning at 300 rpm, followed by final spread at 2000 rpm for 20 seconds. The infiltrated film was then baked, cured and annealed according to the recipe described in Example 2. SEM images of the annealed film showed no cracking of the film in the gaps and in the top layer of the infiltrate material. The infiltrated wafer was soaked in BOE 500:1 solution for 20 seconds. No etching was observed around the corners of the wide and narrow gaps in SEM pictures at 80000 magnification.

EXAMPLE 10

Premixing of Colloidal Silica and Doped Silicate Solutions

A 4 wt % solution of colloidal silica was prepared by adding 23 grams of cyclohexanone to 15 grams of 10% colloidal silica stock solution. 9 grams of TEOS was mixed with 9.5 grams of acetone, followed by the addition of 1.38 g 1N nitric acid and 0.58 grams of deionized water. 10 grams of 5 wt % $P_2O_5$ solution in isopropyl alcohol (IPA) was added and mixed well. The mixture was stirred for 72 hours at room temperature. The solution was then diluted with 15.23 gm of acetone and 15.23 gm of IPA to give a final solid content of 4 weight percent P-doped silicate.

The following three solutions were prepared and spin-coated onto blanket wafers, followed by bake, cure and anneal as Example 2:

Solution 10A: 10 grams of 4% silica and 10 grams of 4% P-doped silicate solution Solution 10B: 16 grams of 4% silica and 4 grams of 4% P-doped silicate solution Solution 10C: 18 grams of 4% silica and 2 grams of 4% P-doped silicate solution Results are shown in Table 5 below.

TABLE 5

Premixing of Colloidal Silica and P-Doped Silicate Solutions

| Solution | Process (° C.) | SiO$_2$:Silicate | Film Thickness | Refractive Index | Shrinkage from bake | Etch Rate in 500:1 BOE |
|---|---|---|---|---|---|---|
| 10A | 700 | 1:1 | 798 Å | 1.440 | 8.5% | 1.46 Å/sec |
| 10A | 900 | 1:1 | 705 Å | 1.441 | 19.2% | 0.58 Å/sec |
| 10B | 700 | 4:1 | 750 Å | 1.380 | 5.6% | 0.88 Å/sec |
| 10B | 900 | 4:1 | 699 Å | 1.388 | 12.2% | 0.61 Å/sec |
| 10C | 700 | 9:1 | 805 Å | 1.270 | 3.3% | — |
| 10C | 900 | 9:1 | 776 Å | 1.280 | 6.8% | — |

Although the present invention has been described in terms of specific materials and conditions, the description is only an example of the invention's application. Various adaptations and modifications of the processes disclosed are contemplated within the scope of the invention as defined by the following claims.

We claim:

1. A method of forming a dielectric layer on a substrate comprising:

depositing a colloidal dispersion on a substrate;

curing the colloidal dispersion to form an intermediate layer; and infiltrating the intermediate layer with a matrix material to form an infiltrated layer.

2. The method of claim 1, wherein the colloidal dispersion comprises particles of a dense material dispersed in a solvent.

3. The method of claim 2, wherein the dense material comprises a dielectric material or a material convertible to a dielectric material by oxidation or nitridation.

4. The method of claim 1, further comprising curing the infiltrated layer.

5. The method of one of claim 1 or 4, further comprising baking at least one of the colloidal dispersion or the intermediate layer.

6. The method of claim 5, wherein baking comprises at least one bake step wherein the at least one bake step comprises a temperature in the range of about 75 to about 300° C.

7. The method of claim 6, wherein baking comprises at least two bake steps and wherein the bake steps comprise at least one temperature in the range of about 75 to about 300° C.

8. The method of one of claim 1 or 4, wherein curing comprises thermal processing, an annealing method or a combination thereof.

9. The method of claim 8, wherein the annealing method comprises electron beam annealing, ion beam annealing or a combination thereof.

10. The method of one of claim 1 or 4, wherein curing comprises a vacuum atmosphere.

11. The method of one of claim 1 or 4, wherein curing comprises an atmosphere of nitrogen, oxygen, nitrogen-bearing species, oxygen-bearing species, ozone, steam, ammonia, argon, carbon monoxide, carbon dioxide, nitrous oxide, nitric oxide, helium, hydrogen or mixtures thereof.

12. The method of claim 11, wherein the atmosphere comprises oxygen, nitrogen, oxygen-bearing species, nitrogen-bearing species or a combination thereof.

13. The method of claim 1, wherein the infiltrated layer is modified forming the dielectric layer.

14. The method of claim 1, wherein infiltrating the intermediate layer with a matrix material comprises infiltrating the intermediate layer with a coating solution of a spin-on polymer material.

15. The method of claim 14, wherein the spin-on polymer material comprises a material comprising silicates, hydrogen silsesquioxanes, organosilsesquioxanes, organosiloxanes, silsesquloxane-silicate copolymers, silazane-based materials, polycarbosilanes or acetoxysilanes.

16. The method of claim 14, wherein the spin-on polymer material comprises arsenic, antimony, phosphorous or boron.

17. The method of claim 1, wherein the particles of the dense material comprise silica, silicon, silicon nitride, silicon oxynitride, aluminum, aluminum nitride or aluminum oxide.

18. The method of claim 17, wherein the dense material further comprises a species comprising arsenic, antimony, phosphorous or boron.

19. The method of claim 1, wherein the particles have a characteristic dimension between about 2 nanometers and about 50 nanometers.

20. The method of claim 1, wherein the dielectric layer is a pre-metal dielectric layer on an integrated circuit device.

21. The method of claim 1, wherein the dielectric layer fills a trench in a shallow trench isolation structure.

22. The method of claim 1, wherein the dielectric layer fills gaps of dimension less than 100 nanometers.

23. The method of claim 1, wherein the dielectric layer is resistant to standard buffered oxide etchant solutions.

24. The method of claim 1, wherein infiltrating the intermediate layer with a matrix material comprises depositing a matrix material on the intermediate layer by chemical vapor deposition.

25. The method of claim 1, wherein infiltrating the intermediate layer with a matrix material comprises depositing a matrix material on the intermediate layer by atomic layer deposition.

26. The method of claim 1, wherein the matrix material comprises phosphosilicate glass, borosilicate glass or borophosphosilicate glass.

27. A dielectric material formed from the method of claim 1.

28. A dielectric material formed from the method of claim 4.

29. A component comprising the dielectric material of claim 27.

30. A component comprising the dielectric material of claim 28.

* * * * *